(12) United States Patent
Deane et al.

(10) Patent No.: US 6,545,319 B2
(45) Date of Patent: Apr. 8, 2003

(54) THIN FILM TRANSISTORS

(75) Inventors: Steven C. Deane, Redhill (GB); Ian D. French, Brighton (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/023,398

(22) Filed: Dec. 13, 2001

(65) Prior Publication Data

US 2002/0079496 A1 Jun. 27, 2002

(30) Foreign Application Priority Data

Dec. 21, 2000 (GB) ............................................. 0031220
Feb. 22, 2001 (GB) ............................................. 0104338

(51) Int. Cl.[7] ..................... H01L 31/0392; H01L 29/04; H01L 31/20; H01L 31/036; H01L 31/0376
(52) U.S. Cl. ............................ 257/350; 257/59; 257/72
(58) Field of Search ............................ 257/59, 72, 350

(56) References Cited

U.S. PATENT DOCUMENTS

| 5,614,732 A | 3/1997 | Yamazaki | 257/66 |
| 6,399,988 B1 * | 6/2002 | Yamazaki | 257/344 |
| 6,407,430 B1 * | 6/2002 | Ohtani et al. | 257/350 |

FOREIGN PATENT DOCUMENTS

| JP | 03085767 | 4/1991 | ......... H01L/29/784 |
| WO | WO9930369 | 6/1999 | ........... H01L/27/12 |
| WO | 9949510 | 9/1999 | ........... H01L/21/84 |

OTHER PUBLICATIONS

"Application of Metal–Induced Unilaterally Crystallized Polycrystalline Silicon Thin–film Transistor . . . " Z. Meng et al, International Electron Devices Meeting Dec. 10, 2000 p. 611–614.

"The Physics of Amorphous–Silicon Thin–Film Transistors" M. Powell, Vo. 36, No. 12, Dec. 1, 1989, p. 2753–2763.

"A Color LC Panel Using a Very Thin Film Transistor (V–TFT)", by Tooru Sakai et al, Conference Record of the 1985 International Display Research Conference, pp. 30–31.

"TFT Throughput and Performance Improvement via Doubling of the RF Frequency in the KAI 20 PECVD system", by Philippe Grousset et al, Conference Proceedings of Asia Display 98 Conference, pp. 451–454.

* cited by examiner

*Primary Examiner*—Ngân V. Ngô

(57) ABSTRACT

An insulated-gate thin film transistor comprises a gate electrode and source and drain electrodes. The source and drain electrodes are laterally spaced apart, and are vertically separated from the gate electrode by a gate insulator layer and an amorphous silicon layer. A region of the amorphous silicon layer is vertically aligned with the lateral spacing between the source and drain electrodes defining the transistor channel, and the region of the amorphous silicon layer has a thickness of less than 100 nm, and is doped with phosphorus atoms with a doping density of between $2.5 \times 10^{16}$ and $1.5 \times 10^{18}$ atoms per $cm^3$. This enables the mobility to be increased so that the thickness reduction of the silicon layer can be tolerated. This thickness reduction enables the photosensitivity of the layer to be reduced sufficiently to avoid the need for a black mask layer.

11 Claims, 3 Drawing Sheets

THIN FILM TRANSISTORS

This invention relates to thin film transistors, and particularly to transistors for use in the active plate of active matrix liquid crystal displays. The invention also relates to the active plate itself and to the display.

A liquid crystal display typically comprises an active plate and a passive plate between which liquid crystal material is sandwiched. The active plate comprises an array of transistor switching devices, typically with one transistor associated with each pixel of the display. Each pixel is also associated with a pixel electrode on the active plate to which a signal is applied for controlling the brightness of the individual pixel. The transistors typically comprise amorphous silicon thin film transistors.

A large area of the active plate is at least partially transparent, and this is required because the display is typically illuminated by a back light. Mainly, the areas covered by the opaque row and column conductors are the only opaque parts of the plate. If the pixel electrode does not cover the transparent area, then there will be an area of liquid crystal material not modulated by the pixel electrode but which does receive light from the back light. This reduces the contrast of the display. A black mask layer is typically provided for shielding these areas of the active plate, and additionally to shield the transistors as their operating characteristics are light-dependent.

Conventionally, the black mask layer is located on the passive plate of the active matrix cell. However, the overlap between the black mask layer and the pixel electrodes needs to be large in this case as a result of poor cell coupling accuracy. This overlap reduces the aperture of the display pixels, which reduces the power efficiency of the display. This is particularly undesirable for battery operated devices, such as portable products.

It has been proposed to use layers of the active plate to provide the required masking function. For example, one proposal is to define the pixel electrodes to overlap the row and column conductors, so that there is no gap between the row and column conductors and the pixel electrodes, which would otherwise need to be shielded. This requires a thick low dielectric constant insulator between the pixel electrodes and the row and columns. This type of display is known as a Field Shielded Pixel (FSP) design. Although the overlap of the pixel electrodes over the row and column conductors eliminates any gap which requires shielding, light must still be prevented from reaching the transistor in view of the photosensitivity of the transistor. Therefore, an organic black layer is also provided to cover the transistor region and prevent photo-induced leakage in it. Thus, the removal of the black mask from the passive plate has in the past been at the expense of an extra mask step for the active plate.

The cost of manufacturing a liquid crystal display results largely from the cost of manufacturing the active plate, and this depends upon the number of mask steps used in the process. A reduction in the number of masks could be achieved if the need for the black mask layer could be avoided, by making the transistors less photosensitive.

It is known that the photosensitivity of the transistor is a function of the thickness of the amorphous silicon layer defining the body of the transistor. The most common transistor design for use in liquid crystal displays is the bottom gate back channel etch (BCE) transistor. The amorphous silicon layer comprises a lower intrinsic part which defines the transistor channel, and an upper n-type doped part, which provides electron injection, and prevents hole injection at the source drain interface. The upper n-type doped part is removed from the area between the source and drain, as the channel area of the transistor needs to be intrinsic. Conventionally, the thickness of the intrinsic part of the silicon layer is at least 150 nm, and the n-type doped part is around 30 nm thick. After the so-called back channel etching, to remove the n-type layer from the channel, the remaining thickness of the intrinsic amorphous silicon layer defining the transistor body is typically at least 100 nm.

The operation of the thin film transistor relies upon so-called band bending, by which the conduction level is bent towards the Fermi-level of the semiconductor. For transistor dimensions suitable for active matrix display applications, intrinsic amorphous silicon thickness of around 100 nm has been found to be the minimum acceptable thickness for sufficient band bending to occur in the material for the transistor operating characteristics to be suitable. As the thickness of the amorphous silicon layer is reduced, the interface states at the top of the channel layer (the "back channel" area) lead to Fermi level pinning. This is a result of the high density of defect states resulting from the plasma damage during removal by etching of the n-type part of the silicon layer. A lower silicon thickness results in degraded device mobility and higher threshold voltage, and therefore poorer switching characteristics. Unfortunately, the required silicon thickness results in levels of photosensitivity which means that light shielding is required.

According to a first aspect of the invention, there is provided an insulated-gate thin film transistor comprising a gate electrode and source and drain electrodes, the source and drain electrodes being laterally spaced apart, and both being vertically separated from the gate electrode by a gate insulator layer and an amorphous silicon layer, a region of the amorphous silicon layer vertically aligned with the lateral spacing between the source and drain electrodes defining the transistor channel, wherein the region of the amorphous silicon layer has a thickness of less than 100 nm, and is doped with n-type dopant atoms with a doping density of between $2.5 \times 10^{16}$ and $1.5 \times 10^{18}$ atoms per $cm^3$.

By "vertical" is meant in a direction perpendicular to the substrate (i.e. in the direction of stacking of layers), and by "lateral" is meant substantially parallel to the substrate (i.e. in the plane of the thin film layers).

The invention enables the mobility to be increased so that the thickness reduction of the silicon layer can be tolerated. This thickness reduction enables the photosensitivity of the layer to be reduced sufficiently to avoid the need for a black mask layer. The n-type dopant preferably comprises phosphorus.

The thickness of the region of the amorphous silicon layer is preferably between 40 nm and 80 nm and more preferably between 40 nm and 60 nm. The doping density may be between $5 \times 10^{16}$ and $1.5 \times 10^{17}$ atoms per $cm^3$.

The silicon layer may comprise a lower intrinsic layer and an upper n-type layer, and wherein the n-type layer is removed from the region of the amorphous silicon layer vertically aligned with the lateral spacing between the source and drain electrodes. This defines a BCE structure.

According to a second aspect of the invention, there is provided an active plate for a liquid crystal display, comprising:
   a gate conductor layer over an insulating substrate defining gate conductors for pixel transistors and also defining row conductors;
   a gate insulator layer over the gate conductor layer;
   a silicon layer over the gate insulator layer and defining a transistor body region overlying the gate conductors;

a source and drain conductor layer over the silicon layer defining source and drain conductors for the pixel transistors and also defining column conductors each connected to one of the source and drain of an associated transistor; and a pixel electrode layer defining pixel electrodes which contact the other of the source and drain of the associated transistor, wherein the transistor body region has a thickness of less than 100 nm, and is doped with n-type dopant atoms with a doping density of between $2.5 \times 10^{16}$ and $1.5 \times 10^{18}$ atoms per cm$^3$.

The pixel electrodes may each occupy a pixel space bordered by row and column conductors, and the pixel electrodes partially overlap those row and column conductors. This avoids the need for a black mask layer for any gap between the pixel electrodes and the rows and columns, and the thin silicon layer avoids the need for a black mask layer to shield the transistor.

The invention also provides an active matrix liquid crystal display comprising an active plate of the invention, a passive plate, and a layer of liquid crystal material sandwiched between the active and passive plates.

According to a third aspect of the invention, there is provided a method of forming an active plate for a liquid crystal display, comprising:

depositing and patterning a gate conductor layer over an insulating substrate;

depositing a gate insulator layer over the patterned gate conductor layer;

depositing a silicon layer over the gate insulator layer, the deposition comprising plasma deposition from a gas comprising at least a compound including an n-type dopant atom and a gas containing silicon, with the ratio of the volume of the compound to the volume of the gas containing silicon being selected to give a doping density of the n-type dopant atoms in the silicon layer of between $2.5 \times 10^{16}$ and $1.5 \times 10^{18}$ atoms per cm$^3$;

depositing and patterning a source and drain conductor layer over the silicon layer; and forming a pixel electrode layer for contacting one of the source and drain of the transistor.

The compound including a dopant atom preferably comprises phosphine, and the gas containing silicon preferably comprise silane, with the ratio of the volume of phosphine to the volume of silane in the range $1 \times 10^{-6}$ to $6 \times 10^{-5}$.

Preferably, the gate conductor layer defines row conductors and the source and drain conductor layer defines column conductors and the pixel electrode layer defines pixel electrodes which each occupy a pixel space bordered by row and column conductors and which partially overlap those row and column conductors.

An example of the invention will now be described in detail with reference to the accompanying drawings, in which.

Figure 1A:
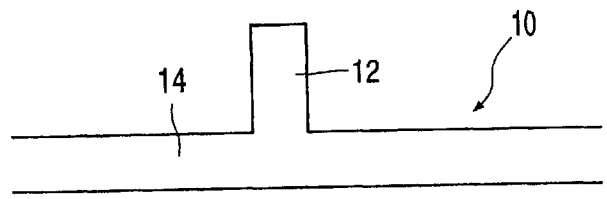
FIG. 1 illustrates a known method of producing an active plate for an active matrix liquid crystal display.

It should be noted that the figures are diagrammatic and not drawn to scale. Relative dimensions and proportions of parts of these figures have been shown exaggerated or reduced in size, for the sake of clarity and convenience in the drawings.

FIG. 1 illustrates the essential process steps for manufacturing a known active plate using a field shielded pixel design.

FIG. 1A shows a patterned gate conductor layer 10, which defines a transistor gate 12 which is connected to an associated row conductor 14. The gate conductor layer 10 comprises an opaque material, for example chromium. Patterning to achieve the layout shown in FIG. 1A is achieved using a wet etching technique. A gate insulator layer is provided over the entire substrate overlying the gate conductor layer 10. This gate insulator layer may be a single layer of, for example, silicon nitride or else it may comprise a multiple-layer structure. A silicon layer, for example hydrogenated amorphous silicon, is deposited over the gate insulator layer overlying the entire substrate. A doped n$^+$ silicon contact layer is also deposited over the amorphous silicon layer. This completes the structure shown in FIG. A, although the gate insulator layer and the silicon layer are not shown.

The silicon layer may comprise a three layer structure of a lower thin undoped layer, a thicker middle low doped layer and a thin highly doped top contact layer.

The amorphous silicon is deposited by a PECVD process, namely deposition from a plasma.

Figure 1B:
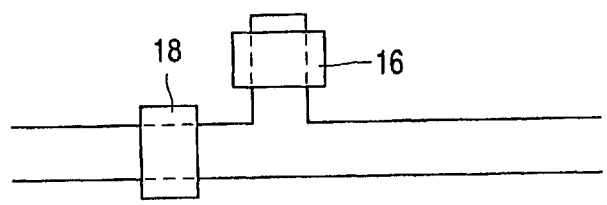

The semiconductor layer is patterned to define the semiconductor body 16 of the transistor, as well as an insulator layer 18 to reduce capacitive coupling at the cross-over between row and column conductors. The patterned semiconductor layer 16, 18 is shown in FIG. 1B.

Figure 1C:
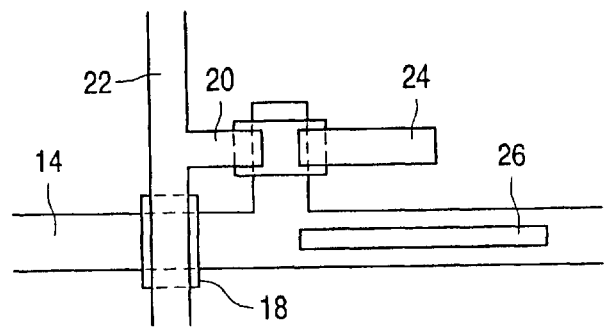

A source and drain conductor layer is deposited and patterned over the silicon layer which defines a transistor source 20 connected to a column conductor 22, and a drain region 24. As shown in FIG. 1C, the region 18 provides insulation at the cross-over of the row 14 and column 22 conductors. The source and drain conductor layer also defines a capacitor top contact 26. This is a pixel charge storage capacitor defined by the row conductor 14, the gate insulator layer and the top contact 26.

Although not shown in the Figure, a BCE transistor also requires removal of the n$^+$ doped part of the silicon layer from above the transistor channel, and this is achieved by partially etching the silicon layer between the source and drain electrodes. The n$^+$ etch is performed just after the source drain metal etching, as all unwanted n$^+$ silicon is exposed at this time.

Figure 1D:
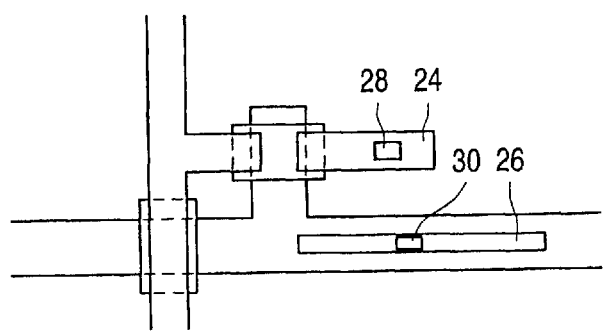
Figure 1E:
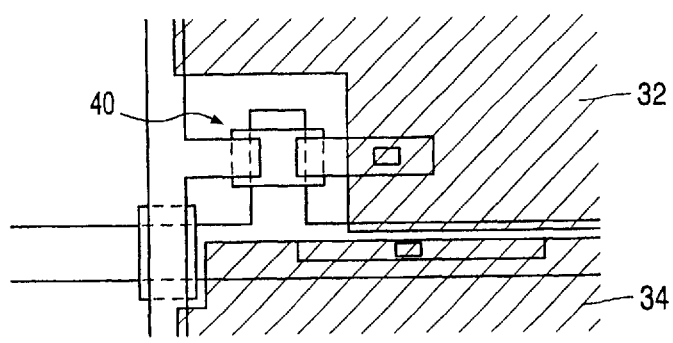

As shown in FIG. 1D a passivation layer is deposited over the entire structure and through-holes 28, 30 are provided to enable connection through the passivation layer to the drain 24 and to the capacitor top contact 26. The passivation layer has a low dielectric constant and high thickness, for example dielectric constant of 2.3 and thickness 2 µm, and may comprise a spin-on polymer layer. Finally, the pixel electrodes 32, 34 are deposited over the passivation layer with each pixel electrode making contact through the through-holes 28, 30 to a drain 24 of the associated switching transistor and to the top contact 26 of the pixel charged storage capacitor.

The pixel electrodes overlap the row and column conductors, and this is possible as a result of the electrical properties of the passivation layer. This avoids the need to provide shielding of any space between the pixel electrodes and the row and column conductors.

Figure 2:
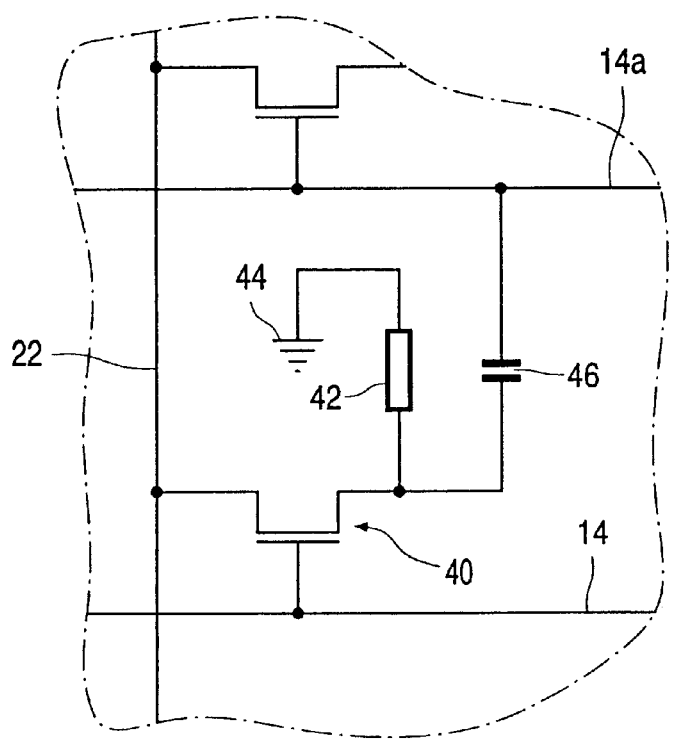
FIG. 2 shows the electrical equivalent circuit of one pixel of the display.

FIG. 2 shows the electrical components which make up the pixels shown in FIG. 1. The row conductor 14 is connected to the gate of the TFT 40, and the column electrode 22 is coupled to the source, as explained with reference to FIG. 1. The liquid crystal material provided over the pixel effectively defines a liquid crystal cell 42 which extends between the drain of the transistor 40 and a common ground plane 44. The pixel storage capacitor 46 is connected between the drain of the transistor 40 and the row conductor 14a associated with an adjacent row of pixels.

In the process described with reference to FIG. 1, the row and column electrodes are used to provide masking of the pixel. In particular, the overlap of the pixel electrodes 32 and 34 over the row and column conductors eliminates any gap which requires shielding. However, light must still be prevented from reaching the transistor in view of the photo-sensitivity of the transistor. Therefore, an organic black layer is also provided to cover the transistor region and prevent photo-induced leakage in it. This process allows the removal of the black mask from the passive plate, but requires an extra mask step for the active plate. This additional step is not shown in FIG. 1, but the mask may be provided on the active plate either beneath the passivation layer or else after formation of the pixel electrodes.

Although this method enables the black mask layer to be provided only on the active plate, which enables more accurate alignment, it increases the production cost of the display as a result of the increased mask steps.

Figure 3:
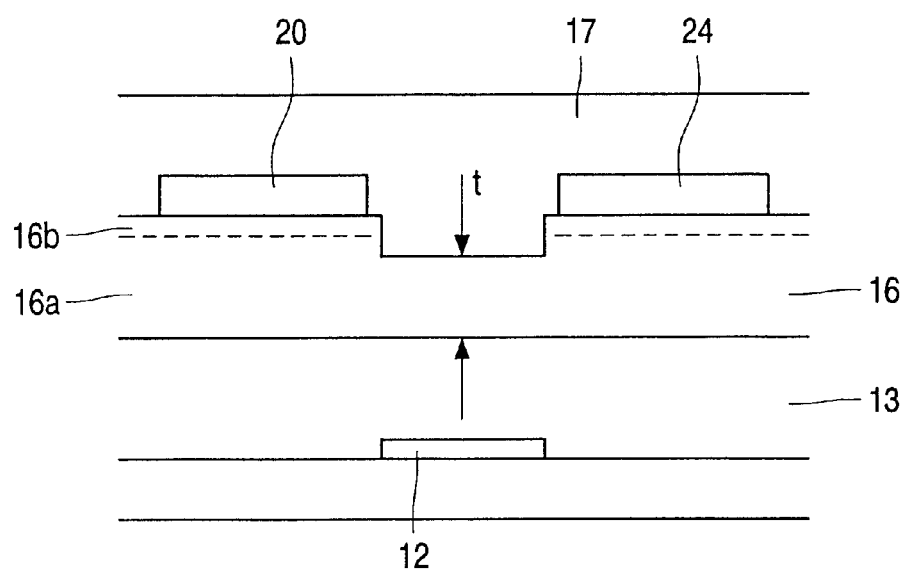
FIG. 3 shows a simplified cross section of the transistor which may be dimensioned in a conventional manner or in a manner according to the invention.

FIG. 3 shows a simplified cross section of the transistor. The gate electrode 12 has a thickness between 100 and 200 nm and is separated from the source and drain electrodes 20, 24 by the gate insulator 13 (for example SiN of 200 nm to 400 nm thickness) and the amorphous silicon layer 16 which has a lower intrinsic part 16a and an upper $n^+$-type part 16b. The passivation layer 17 overlies the entire structure. As shown, the $n^+$-type part 16b is removed from the channel area of the transistor.

Conventionally, the thickness t of the channel area of the silicon layer 16 is more than 100 nm. For example, the intrinsic part 16a has a thickness between 150 nm and 300nm, and the $n^+$ part has a thickness of around 30 nm.

It is desirable reduce the thickness t, to reduce the photosensitivity of the device, but this gives rise to degraded performance, as discussed above. Also the thicker the layer, the higher the parasitic resistance between the source and drain electrodes and the channel of the transistor (which is effectively the part of the silicon layer nearest the gate, namely the lower part of the layer 16a.

Reducing the thickness t gives rise to a more than linear reduction in photosensitivity, because plasma damage during etching results in lower photosensitivity of the top of the channel area (for example the top 30 nm), and the interface between the gate insulator and the silicon layer results in lower photosensitivity in the lower part of the channel. The photosensitivity is dominated by surface recombination, so that as the layer becomes thin, carriers recombine very quickly, before the lateral filed has managed to separate them. Therefore, a central "pure" part of the layer 16 contributes most to the photosensitivity of the device. A reduction in thickness of the layer 16 principally reduces the thickness of this part of the layer 16.

The invention is based on the recognition that n-type doping of the semiconductor layer, for example with phosphorus, can enable a significant reduction in thickness, with the doping compensating for the reduction in mobility.

Figure 4:
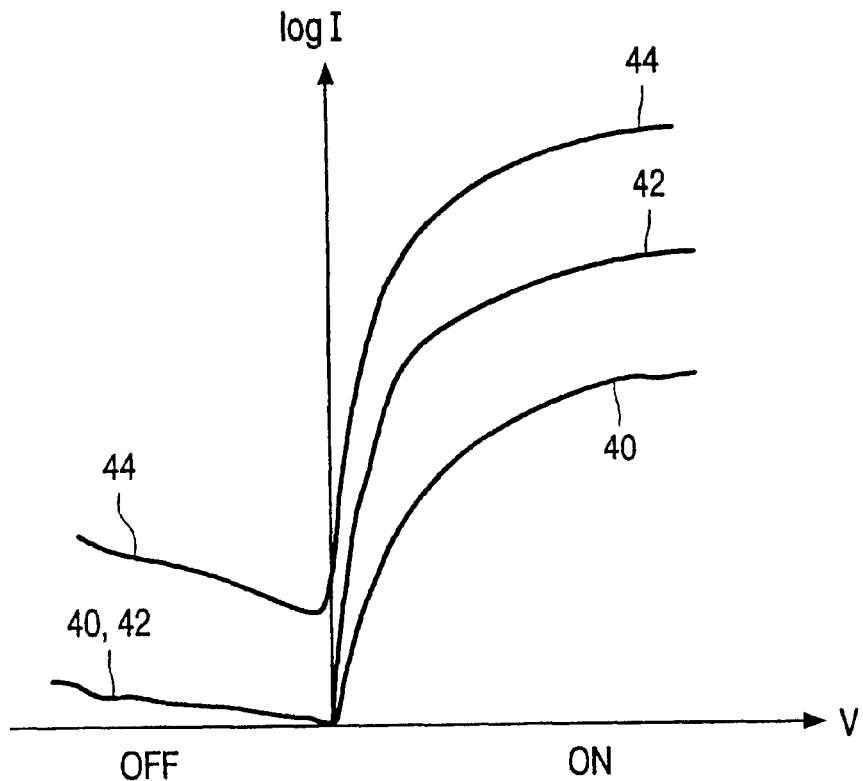
FIG. 4 shows schematically the transistor switching characteristics as a function of the doping level.

FIG. 4 shows the effect of the doping on the transistor characteristics for a TFT with channel length pf 5–6 $\mu$m, which is practical for use in active matrix liquid crystal displays. The thickness of the amorphous silicon layer in the region of the channel is 50 nm. The channel length affects the mobility of the transistor, and for short channel lengths the parasitic resistances become significant in determining the device mobility. FIG. 4 shows (schematically) the source-drain current as a function of the gate-source voltage. This represents the transistor on and off characteristics.

Plot 40 represents the characteristics for an undoped silicon layer. The OFF characteristics are satisfactory, whereas the mobility of the device does not give rise to sufficient turn on for the current driving requirements of liquid crystal display applications. Plot 42 shows the effect of the doping of the invention. Without adversely affecting the OFF characteristics, the ON characteristics are improved sufficiently for the device to be used in active matrix display applications.

A low level of doping is required, and as shown by plot 44, if the doping concentration is too high there is significant leakage current in the OFF state of the transistor.

The optimum level of doping will depend upon the switching characteristics required, the channel length of the transistor, and the required thickness of the silicon layer to reduce the photosensitivity to avoid the need for a black mask layer. Furthermore, the optimum doping level increases as the deposition speed is increased.

The doping is achieved during the plasma deposition of the amorphous silicon. In particular, phosphine ($PH_3$) is added as a plasma gas to the silane ($SiH_4$). It has been found that the ratio of the volume of phosphine to the volume of silane should be in the range $1\times10^{-6}$ to $6\times10^{-5}$ in the deposition gas.

Typically, the amorphous silicon has a density of approximately $5\times10^{22}$ atoms per $cm^3$, and the number of phosphorus atoms in the deposited layer should be in the range $2.5\times10^{16}$ to $1.5\times10^{18}$ atoms per $cm^3$, or even more preferably $5\times10^{16}$ to $1.5\times10^{17}$ atoms per $cm^3$. These ranges provide improved ON characteristics with limited degradation of the OFF characteristics for current deposition rates. In particular, the threshold voltage is reduced, and the mobility and subthreshold slope are improved.

The invention enables the thickness of the amorphous silicon layer to be reduced below 100 nm, and preferably to the range 40 nm to 80 nm.

In the example described above, the amorphous silicon layer 16 has a lower intrinsic part 16a and an upper $n^+$-type part 16b. It is also possible to deposit the amorphous silicon as three layers—a low deposition rate undoped layer, a high deposition rate microdoped layer and a highly doped contact layer. The low deposition rate gives the best interface, but is rather sensitive to the microdoping, so is best undoped. Microdoping the high deposition rate material gives the main benefits, and the high deposition rate makes the material less sensitive to doping, making the level easier to control.

The active plate of the transistor can be made using conventional techniques, as described generally with reference to FIG. 1. The invention enables the black mask to be eliminated, and enables a thinner amorphous silicon layer to be deposited. This also increases the throughput in the deposition equipment, or allows higher quality material to be deposited, as performance is generally degraded by increased deposition rate.

Figure 5:
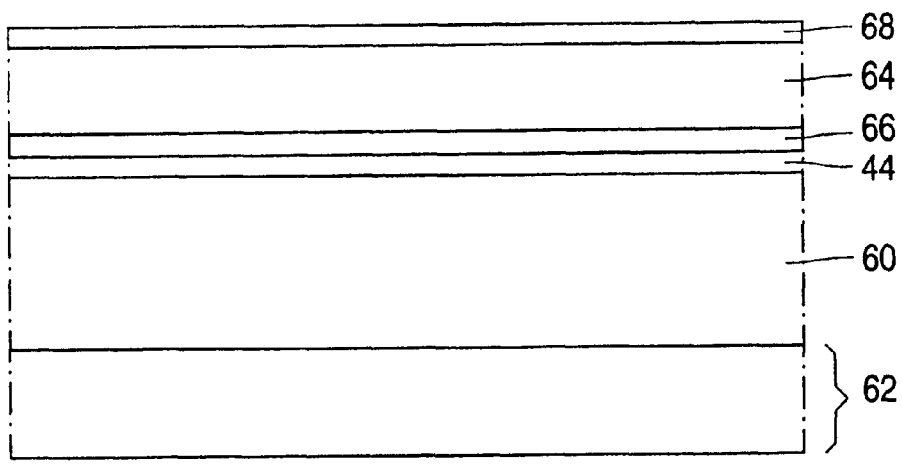
FIG. 5 shows the structure of a complete liquid crystal display.

FIG. 5 shows the structure of a complete liquid crystal display. A layer of liquid crystal material 60 is provided over the active plate 62, which comprises the structure described above. A further substrate 64 overlies the layer of liquid crystal material. This further substrate 64 may be provided on one face with an arrangement of colour filters 66 and a plate defining the common electrode 44 (shown in FIG. 2). A polarizing plate 68 is also provided on the opposite side of the substrate 64.

As this invention is concerned specifically with the transistor substrate, the operation and construction of the liquid crystal display will not be described in any further detail as this will be apparent to those skilled in the art.

In the example described, a storage capacitor is defined using an adjacent row conductor. Instead, a separate storage capacitor line may be provided.

Additional layers to those described may be provided, and there are various alternatives which will be apparent to those skilled in the art. The specific processing parameters and materials have not been described in detail in this application, as this invention relies upon known individual processing steps and materials. The steps, and the range of possible alternatives, will be apparent to those skilled in the art.

The invention has been described in detail with reference to BCE transistor designs. The invention may also be applied to etch stop transistor designs or to any other amorphous silicon thin film transistor technology. Furthermore, although the transistor of the invention will be particularly useful in the manufacture of active matrix liquid crystal displays, it may equally be applied to other fields where arrays of small-area transistors are required, for example imaging arrays, for example medical X-ray imaging arrays or fingerprint sensors.

In the specific example described above, phosphorus is used as the n-type dopant for increasing the conductivity of the channel. However, other n-type dopants may also be used, for example nitrogen, arsenic and antinomy. The deposition of the semiconductor layer may then the comprise plasma deposition from a gas comprising at least a compound including the n-type dopant atom and a silicon containing gas, for example silane. The compound including a dopant atom may comprise phosphine, and the gas containing silicon may comprise silane. The ratio of the volume of phosphine to the volume of silane may be in the range $1\times10^{-6}$ to $6\times10^{-5}$.

Silane can be used as it is cheap and readily available, but other silicon containing compounds may also be used, such as chlorosilane or disilane.

What is claimed is:

1. An insulated-gate thin film transistor comprising a gate electrode and source and drain electrodes, the source and drain electrodes being laterally spaced apart, and both being vertically separated from the gate electrode by a gate insulator layer and an amorphous silicon layer, a region of the amorphous silicon layer vertically aligned with the lateral spacing between the source and drain electrodes defining the transistor channel, wherein the region of the amorphous silicon layer has a thickness of less than 100 nm, and is doped with n-type dopant atoms with a doping density of between $2.5\times10^{16}$ and $1.5\times10^{18}$ atoms per $cm^3$.

2. A transistor as claimed in claim 1, wherein the dopant atoms comprise phosphorus.

3. A transistor as claimed in claim 1, wherein the thickness of the region of the amorphous silicon layer is between 40 nm and 80 nm.

4. A transistor as claimed in claim 3, wherein the thickness of the region of the amorphous silicon layer is between 40 nm and 60 nm.

5. A transistor as claimed in claim 1, wherein the doping density is between $5\times10^{16}$ and $1.5\times10^{17}$ atoms per $cm^3$.

6. A transistor as claimed in claim 1, wherein the silicon layer comprises at least a lower intrinsic layer and an upper n-type layer, and wherein the n-type layer is removed from the region of the amorphous silicon layer vertically aligned with the lateral spacing between the source and drain electrodes.

7. An active plate for a liquid crystal display, comprising:
   a gate conductor layer over an insulating substrate defining gate conductors for pixel transistors and also defining row conductors;
   a gate insulator layer over the gate conductor layer;
   a silicon layer over the gate insulator layer and defining a transistor body region overlying the gate conductors;
   a source and drain conductor layer over the silicon layer defining source and drain conductors for the pixel transistors and also defining column conductors each connected to one of the source and drain of an associated transistor; and
   a pixel electrode layer defining pixel electrodes which contact the other of the source and drain of the associated transistor, wherein the transistor body region has a thickness of less than 100 nm, and is doped with n-type dopant atoms with a doping density of between $2.5\times10^{16}$ and $1.5\times10^{18}$ atoms per $cm^3$.

8. An active plate as claimed in claim 7, wherein the dopant atoms comprise phosphorus.

9. An active plate as claimed in claim 7, wherein the silicon layer comprises at least a lower intrinsic layer and an upper n-type layer, and wherein the n-type layer is removed form the part of the silicon layer which defines the transistor body region.

10. An active plate as claimed in claim 7, wherein the pixel electrodes each occupy a pixel space bordered by row and column conductors, and the pixel electrodes partially overlap those row and column conductors.

11. An active matrix liquid crystal display comprising an active plate as claimed in claim 7, a passive plate, and a layer of liquid crystal material sandwiched between the active and passive plates.

* * * * *